United States Patent
Wood

(10) Patent No.: US 6,281,746 B1
(45) Date of Patent: Aug. 28, 2001

(54) PARAMETRIC CAVITY MICROWAVE AMPLIFIER

(75) Inventor: James Richard Wood, Grapevine, TX (US)

(73) Assignee: Lockheed Martin Corporation, Bethesda, MD (US)

(*) Notice: Subject to any disclaimer, the term of this patent is extended or adjusted under 35 U.S.C. 154(b) by 0 days.

(21) Appl. No.: 09/465,496

(22) Filed: Dec. 16, 1999

(51) Int. Cl.[7] .............................. H03F 7/00; H03F 7/06

(52) U.S. Cl. ............................................. 330/4.5; 330/4.6

(58) Field of Search ............................. 330/4.5, 4.6, 4.9; 333/218

(56) References Cited

U.S. PATENT DOCUMENTS

| | | | |
|---|---|---|---|
| 3,290,619 | 12/1966 | Geusic et al. | 332/7.51 |
| 3,379,956 | 4/1968 | Battles et al. | 321/69 |
| 3,628,186 * | 12/1971 | Rumson et al. | 331/107 R |
| 3,631,331 | 12/1971 | Fairley et al. | 321/69 |
| 3,742,335 | 6/1973 | Konishi | 321/69 |
| 3,772,528 * | 11/1973 | Anderson | 330/4.5 |
| 3,944,950 | 3/1976 | Jacobs et al. | 333/31 |
| 3,963,977 | 6/1976 | Mitsui | 321/69 |
| 4,527,137 | 7/1985 | Hartley | 333/137 |
| 4,595,892 | 6/1986 | Martinetti et al. | 333/218 |
| 4,636,758 | 1/1987 | Mettoudi | 333/218 |
| 4,712,121 | 12/1987 | Yokoyama | 357/4 |
| 4,782,222 | 11/1988 | Ragle et al. | 250/211 |
| 4,996,505 | 2/1991 | Keilmann | 333/218 |
| 5,278,427 | 1/1994 | Choi | 257/17 |
| 5,422,613 | 6/1995 | Nativ | 333/218 |
| 5,731,752 | 3/1998 | Wood | 333/218 |
| 5,796,314 | 8/1998 | Tantawi et al. | 333/20 |
| 5,796,902 * | 8/1998 | Bhat et al. | 385/122 |
| 5,880,921 | 3/1999 | Tham et al. | 361/233 |

OTHER PUBLICATIONS

Stephan Ohr, "Darpa Sows Seeds of a Telecom Revolution," *EE Times*, Aug. 4, 1997, p. 1.

F.M. Mueller, et al "HTS Microwave Cavity with Temperature–Independent Frequencies," *IEEE Transactions on Applied Superconductivity*, vol. 5, No. 2, Jun. 1995, pp 1983–1986.

C.J. Maggiore, et al, "Low–loss Microwave Cavity Using Layered–dielectric Materials," Appl. Phys. Lett 64 (11) Mar. 14, 1994.

E. Yablonovitch, "Photonic Band–gap Structures," Journal of the Optical Society of America Bulletin, vol. 10, No. 2, Feb. 1993, pp. 283–295.

Henry O. Everitt, "Applications of Photonic Band Gap Structures," *Optics and Photonics News*, Nov. 1992, pp 20–23.

"Application Notes for Bulk Window™ Waveguide Switch Elements," M/A Com Semiconductor Products Operation, Burlington, MA 01803, pp 3–3 through 3–8.

N.C. Luhmann, Jr. High Power, High Efficiency, Monolithic Quasi–Optical Frequency Triplers Using Microwave Power Module Drivers, Feb. 27, 1996.

(List continued on next page.)

*Primary Examiner*—Robert Pascal
*Assistant Examiner*—Patricia T. Nguyen
(74) *Attorney, Agent, or Firm*—Sidley Austin Brown & Wood; Stephen S. Sadacca

(57) ABSTRACT

A microwave parametric amplifier uses a circulator to receive an input signal which is provided through a transfer port to an input signal resonant cavity. A pump signal, which is preferably a harmonic of the input signal, is received into a pump signal cavity which is defined by a barrier that is reflective to the pump signal and transmissive to the input signal. A non-linear medium is positioned within the pump signal cavity to produce carriers due to the energy of the pump signal. The input signal interacts with the carriers to produce an amplified input signal which is conveyed from the input signal cavity through the circulator to an output port of the circulator.

20 Claims, 2 Drawing Sheets

OTHER PUBLICATIONS

Joy Yi–Yin Liao, "Frequency Multipliers for Millimeter Wave Applications," Riken Review, No. 11, Dec. 1995, pp5–6.

J. Grenzer, et al, "Frequency Multiplication of Microwave Radiation in a Semiconductor Superlattice by Electrons Capable to Perform Bloch Oscillations," Annalen der Physik, Apr. 1995, pp 265–271.

K.N. Ostricov, et al, "Resonant Second Harmonics Generation of the Submillimeter Surface Wave in the Semiconductor Superlattice Bounded by a Metal," IEEE Antennas and Propagation Society Int'l Symposium, 1995 Digest, vol. I, pp 742–745.

D. Lippens, "Quantum Well Devices for Millimetre Wave Applications," $23^{rd}$ European Microwave Conference, Madrid, Spain, Sep. 1993, pp 61–66.

M. Hadjazi, et al "60 GHz Reflection Gain Based on Superlattice Negative Differential Conductance," *Electronics Letters,* Apr. 15, 1993, vol. 29, No. 8.

Wen–Shiung Lour, "Multi–state Superlattice–Emitter Resonant–Tunneling Bipolar Transistor with Circuit Applications," *Superlattices and Microstructures,* 1993, Academic Press Ltd., pp 81–86.

Federico Capasso, "Quantum Effect Devices: Physics and Applications," edited by Anastassakis & Joannopoulos, $20^{th}$ International Conference on The Physics of Semiconductor, Aug. 1990, pp 379–386.

A.Y. Cho, "Current State and Future Challenge in Molecular Beam Epitaxy (MBE) Research," Molecular Beam Epitaxy 1988, Sapporo, Japan, Reprinted from *Journal of Crystal Growth,* 95 (1989) Nos. 104, pp 1–10.

Tohru Takada et al, "Frequency Triplers and Quadruplers with GaAs Schottky–Barrier Diodes at 450 and 600 GHz," IEEE Transactions on Microwave Theory and Techniques, vol. MTT–27, No. 5, May 1979, pp 519–523.

L.A. Blackwell et al, "Semiconductor–Diode Parametric Amplifiers," Prentice–Hall Inc., 1961, pp 57–60 and 101–121.

* cited by examiner

PARAMETRIC CAVITY MICROWAVE AMPLIFIER

BACKGROUND OF THE INVENTION

In certain fields of use, such as missiles and aircraft, microwave energy is utilized for such purposes as radar and communication. However, as greater levels of energy are needed for these signals, problems of weight, volume and expense are encountered for the electronic equipment needed to produce the required signals. Further, there are limitations for the amount of power available for the generation of these signals. Thus, there exists a need for methods and apparatus to produce microwave signals at desired energy levels by using as little energy and hardware as possible.

SUMMARY OF THE INVENTION

A selected embodiment of the present invention is a microwave parametric amplifier which includes a housing having an interior cavity. A circulator is connected to the housing. The circulator has an input signal port for receiving an input signal, an output signal port and a bidirectional transfer port which is coupled to the interior cavity of the housing. A pump signal port is coupled to the interior cavity of the housing for receiving a pump signal. A non-linear medium is positioned within the interior cavity for receiving the pump signal and thereby liberating carriers within the medium. A frequency selective barrier within the interior cavity substantially reflects the pump signal and is substantially transparent to the input signal. The frequency selective barrier defines a pump signal resonant cavity within the housing interior cavity. An output signal is produced within the interior cavity as a result of interaction of the input signal and the carriers in the non-linear medium. The output signal is conveyed through the bidirectional port to the circulator and to the output port of the circulator. The output signal is an amplified version of the input signal having the same frequency as the input signal but at a greater amplitude.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION

Figure 1:
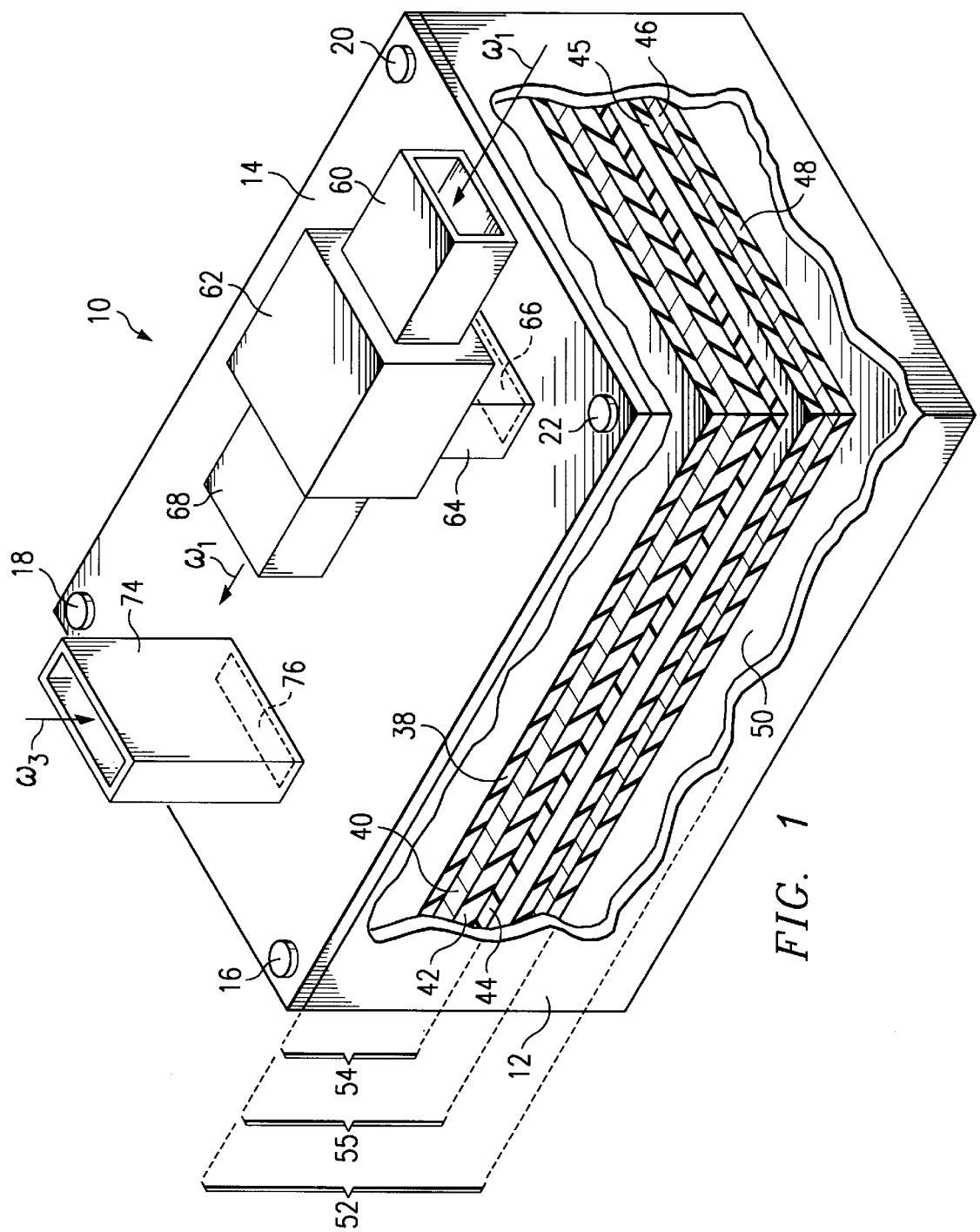
FIG. 1 is a perspective, partially cut away view of a microwave parametric amplifier in accordance with the present invention.

A parametric amplifier 10 in accordance with the present invention is illustrated in FIG. 1. The amplifier 10 receives an input microwave signal $\omega_1$ which is amplified to produce an output signal at the same frequency. A microwave signal $\omega_3$ is provided as a pump signal which is at a higher frequency than the input signal $\omega_1$.

The amplifier 10 includes a lower housing 12 and a top plate 14 which is secured to the housing 12 by means of screws 16, 18, 20 and 22. Housing 12 and the plate 14 are preferably made of brass, aluminum or a plated dielectric material. The input signal $\omega_1$ is provided to the amplifier 10 through an input wave guide 60 which is coupled to a circulator 62. The circulator 62 is connected via a bidirectional signal transfer wave guide 64 to the plate 14. An opening 66 in the plate 14 provides transfer for signals to and from the circulator 62. An output wave guide 68 conveys the amplified output signal $\omega_1$ from the circulator 62.

The pump signal $\omega_3$ is transmitted through a wave guide 74 and an opening 76 in the plate 14 to the interior of the amplifier 10.

The dimensions of each of the wave guides shown in FIG. 1, as well as the dimensions of the amplifier 10, are principally determined by the frequency of the input signal $\omega_1$ and the pump signal $\omega_3$. The input and output wave guides are also referred to as input and output ports.

Within the housing 12 there is provided a grid structure comprising a plurality of layers of materials. At the top of the grid there is provided a nonlinear layer 38. Immediately below the nonlinear layer 38 there are provided temperature compensation dielectric layers 40 and 42. Immediately below the layer 42 there is provided a frequency selective layer 44.

The dimensions and relative sizes as shown in FIG. 1 are for illustrative purposes and do not necessarily represent actual dimensions or size relationships. Actual dimensions are primarily a function of the selected operating frequencies.

The interior of the housing 12 has a surface 50 which is reflective to the microwave energy present within the amplifier 10. The region within the housing 12 between the lower surface of the plate 14 and the surface 50 comprises a pump signal cavity 52 (low band) which is tuned to the frequency of the input signal $\omega_1$. The region within the housing 12 between the lower surface of the plate 14 and the frequency selective layer 44 comprises a harmonic cavity 54 (high band) which is tuned to the frequency of the pump signal $\omega_3$, which is a harmonic of the input signal $\omega_1$. In a selective embodiment, the signal $\omega_3$ is a third harmonic of the signal $\omega_1$, that is, $\omega_3$ has three times the frequency of $\omega_1$.

The amplifier 10 further includes a second group of layers 45, 46 and 48, which are offset by a gap below the layers 38, 40, 42 and 44. The layers 45 and 46 are temperature compensation dielectric layers corresponding to the previously described dielectric layers 40 and 42. The layer 48 is a frequency selective layer that corresponds to the frequency selective layer 44. However, layer 48 has a different cut-off frequency. The frequency selective layer 48 is transparent to the input signal $\omega_1$, but is reflective for an intermediate frequency $\omega_2$, which has a greater frequency than $\omega_1$, but a lesser frequency than $\omega_3$. For example, the signal $\omega_3$ can be three times the frequency of signal $\omega_1$ and the signal $\omega_2$ can be twice the frequency of signal $\omega_1$. Thus, these signals can be harmonics of each other. A preferred relationship is $\omega_3 = \omega_2 + \omega_1$.

The region between the lower surface of plate 14 and the frequency selective layer 48 comprises a cavity 55, which is an idler frequency cavity for energy of the signal $\omega_2$.

The circulator 62 can comprise a latching circulator such as Model OP320 sold by Channel Microwave Corporation, 480 Constitution Avenue, Camarillo, Calif. 93012.

The nonlinear material layer 38 is preferably a doped superlattice, which comprises a photonic band gap structure. Such structures are described in "Photonic Band-Gap Structures" by E. Yablonovitch in *Journal of the Optical Society of America Bulletin*, Volume 10, No. 2, February 1993, pp. 283–295. As described in the article, the dimensions of the material are a function of the operating frequency. An applicable photonic band gap structure is further described in "Applications of Photonic Band Gap Structures" by Henry O. Everitt in *Optics and Photonics News*, November 1992, pp. 20–23.

The temperature compensation dielectric layers 40 and 42 are preferably dielectric layers chosen for their dielectric property behavior over frequency and thickness, so as to achieve a given level of volume fill to achieve temperature compensated device operation. This technique is described in HTS Microwave Cavity with Temperature Independent Frequencies-Mueller, et al. in IEEE Transactions on Applied Superconductivity, Vol. 5, No. 2, June 1995, pp. 1983–1986.

The temperature compensation dielectric layers 40, 42, 45 and 46 may exist separately from, or form part or all of the frequency selective layer 44.

The frequency selective layers 44 and 48 are preferably fabricated as described in "Low-Loss Microwave Cavity Using Layered-Dielectric Materials" by C. J. Maggiore, et al. in *Appl. Phys. Lett.* 64(11), Mar. 14, 1994, starting at p. 1451. The arrangement of dielectric materials described in this paper is a superlattice.

The amplifier 10 is shown in FIG. 1 with a rectangular configuration, which in a selected embodiment can have a length dimension of approximately one (1) inch and a thickness of approximately 0.25 inch. However, it can have other shapes, such as rectangular or round, with the size primarily depending upon the necessary sizes required for the tuned cavities 52, 54 and 55.

The embodiment shown in FIG. 1 uses microwave waveguides but can also utilize other microwave conductors such as microstrip and coaxial lines.

U.S. Pat. No. 5,731,752 entitled "Microwave Signal Frequency Multiplier which issued Mar. 24, 1998 is incorporated by reference herein. The structures shown in this patent may be utilized as a part of the present invention.

Figure 2:
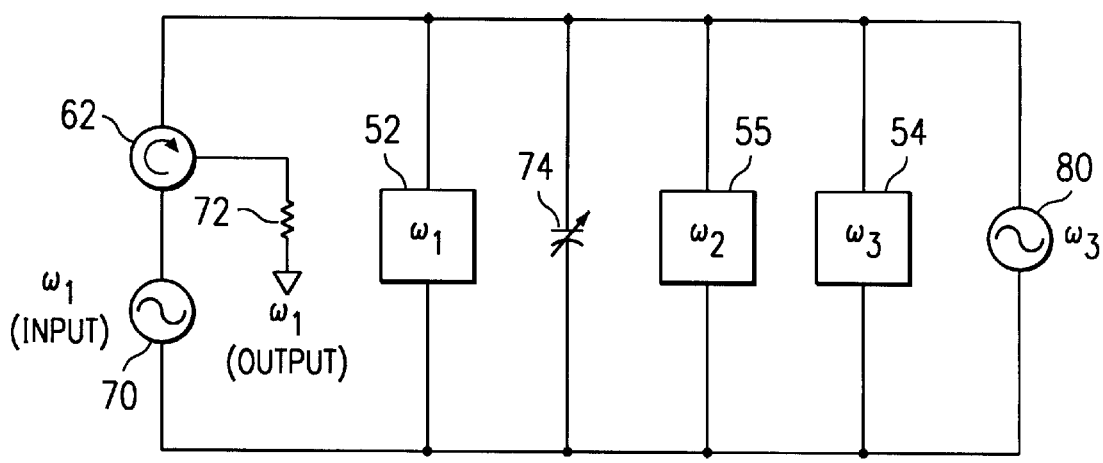
FIG. 2 is a schematic diagram for the parametric amplifier shown in FIG. 1.

An electrical schematic circuit 60 is shown in FIG. 2 for illustrating the operation of the amplifier 10 shown in FIG. 1. Elements that are common to FIGS. 1 and 2 carry the same reference numeral. A source 70 indicates a generator for the input signal $\omega_1$. The source is connected to the circulator 62 via waveguide 60. The output signal $\omega_1$ from the circulator passes through a resistor 72 which represents the impedance of the waveguide 68 for the output signal $\omega_1$. The cavities 52, 55 and 54 correspond to the similarly numbered cavities shown in FIG. 1. A variable capacitor 74 represents the nonlinear layer 38. The pump signal $\omega_3$ is generated by a source 80.

The operation of the amplifier 10 as represented in the schematic circuit 60 and as shown in FIG. 1 is as follows. The relatively low amplitude input signal $\omega_1$ is provided through the waveguide 60 to the circulator 62 where it is transferred through the opening 66 in the plate 14 to the interior of the amplifier 10. The higher energy pump signal $\omega_3$ is input through the waveguide 74 to the interior of the amplifier 10. A high energy field is built up within the cavity 54 due to the input of energy by the signal $\omega_3$. The lower energy input signal $\omega_1$ is resonant within the cavity 52. The lower energy signal $\omega_1$ causes carriers produced by the higher energy signal $\omega_3$ in the nonlinear layer 38 to be transferred along with the energy of the signal at the frequency of $\omega_1$, thereby enhancing the energy of signal $\omega_1$ within the cavity 52. Energy is also transferred from the $\omega_3$ cavity 54 to the intermediate cavity 55 and from there into the $\omega_1$ cavity 52. The result is that the energy resonant within the cavity 52 is increased over that which would be present if the signal $\omega_3$, the pump signal, were not present. This energy is transferred through the waveguide 64 to the circulator 62 where it is passes out through the waveguide 68 as the enhanced amplitude output signal $\omega_1$. Thus, the output signal $\omega_1$ in the waveguide 68 is amplified from the input signal $\omega_1$ which is received through the waveguide 60.

Figure 3:
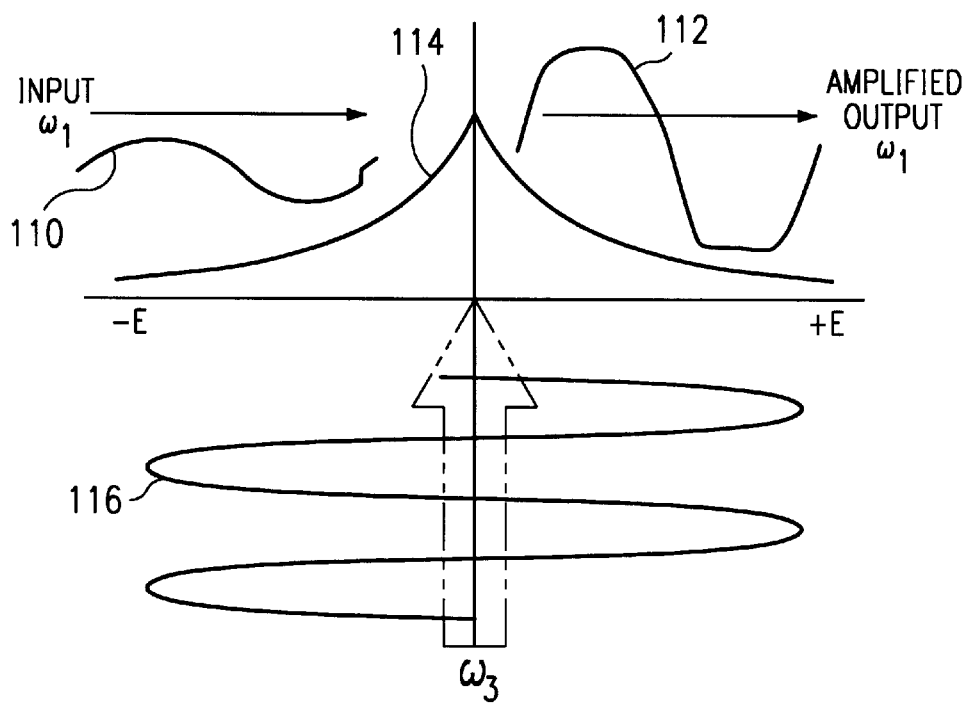
FIG. 3 is a waveform chart for illustrating the operation of the present invention.

This operation is further described in reference to the wave form shown in FIG. 3. The input signal $\omega_1$ is represented by the waveform 110. The output, which is the amplified signal $\omega_1$, is represented by the waveform 112. The pump signal $\omega_3$ is represented by the waveform 116. Note that all three signals have steady state amplitudes for this operation. The diode capacitance/voltage function of the amplifier 10 is shown by the curve 114. The energy of the signal $\omega_3$, at a higher frequency than that of $\omega_1$, is utilized to increase the amplitude of the input signal $\omega_1$ to produce the output signal of $\omega_1$. Thus, the amplifier 13 functions as a parametric amplifier.

In applications where one microwave signal is already being generated at a high frequency, such as for radar, and lower frequency microwave energy is needed, the present invention is particularly applicable.

Although one embodiment of the invention has been illustrated in the accompanying drawings and described in the foregoing Detailed Description, it will be understood that the invention is not limited to the embodiment disclosed, but is capable of numerous rearrangements, modifications and substitutions without departing from the scope of the invention.

What is claimed is:

1. A microwave parametric amplifier, comprising:
    a housing having an interior cavity,
    a circulator having an input signal port for receiving an input signal, an output signal port and a bidirectional port which is coupled to the interior cavity of said housing,
    a pump signal port coupled to the interior cavity of said housing for receiving a pump signal,
    a non-linear medium within said interior cavity for receiving said pump signal and thereby liberating carriers therein,
    a frequency selective barrier within said interior cavity, said frequency selective barrier substantially reflective to said pump signal and substantially transparent to said input signal, wherein said frequency selective barrier defines a pump signal resonant cavity within said housing interior cavity, and
    wherein an output signal is produced within said interior cavity as a result of interaction of said input signal and said carriers, said output signal is conveyed through said bidirectional port to said output port of said circulator, and wherein said output signal is at the frequency of said input signal and has a greater amplitude than said input signal.

2. A microwave parametric amplifier as recited in claim 1 wherein said pump signal is a harmonic of said input signal.

3. A microwave parametric amplifier as recited in claim 1 wherein said circulator and said pump signal port are both connected to a common surface of said housing.

4. A microwave parametric amplifier as recited in claim 1 wherein said non-linear medium and said frequency selective barrier are each planar members.

5. A microwave parametric amplifier as recited in claim 1 including at least one temperature compensation dielectric layer proximate said non-linear medium.

6. A microwave parametric amplifier as recited in claim 1 including a second frequency selective barrier which is substantially reflective to an intermediate frequency signal and is substantially transparent to said input signal and which defines an intermediate frequency cavity within said housing, said intermediate frequency cavity tuned to an intermediate frequency which is between the frequencies of said input signal and said pump signal.

7. A microwave parametric amplifier as recited in claim 6 including at least one temperature compensation dielectric layer proximate said second frequency selective layer.

8. A method of operation for a parametric amplifier, comprising the steps of:

receiving an input signal via an input port to a circulator to the interior of a housing to a first resonant cavity within said housing, said first resonant cavity tuned to the frequency of said input signal, receiving a pump signal via a pump signal port to the interior of said housing into a second resonant cavity which is tuned to the frequency of said pump signal, providing said pump signal to a non-linear medium within said second resonant cavity to produce carriers within said non-linear medium, producing an output signal by the interaction of said input signal with said carriers in said non-linear medium, wherein said output signal is at the frequency of said input signal and has a greater amplitude than said input signal, and conveying said output signal from said first cavity via said circulator to an output port.

9. A method of operation for a parametric amplifier as recited in claim 8 including the step of producing an intermediate signal derived from said pump signal in a third resonant cavity in said housing, said third cavity having a resonant frequency between the frequencies of said input signal and said pump signal.

10. A method of operation for a parametric amplifier as recited in claim 9 wherein said pump signal is a harmonic of said input signal and intermediate signal is a harmonic of said input signal.

11. A method of operation for a parametric amplifier as recited in claim 8 wherein said pump signal is a harmonic of said input signal.

12. A microwave frequency parametric amplifier, comprising:

a three port circulator having an input signal port, an output signal port and a signal transfer port, an input signal cavity connected to receive said input signal via said input signal port and said transfer port, a pump signal port connected to said input signal cavity for receiving a pump signal which has a higher frequency than the frequency of said input signal, a non-linear medium within said pump signal cavity for receiving said pump signal and thereby liberating carriers therein, a frequency selective barrier positioned within said input signal cavity for defining a pump signal cavity for storing energy therein at the frequency of said pump signal, and wherein said input signal and said carriers produce an amplified input signal which is conveyed through said transfer port to said circulator and therefrom to said output signal port.

13. A microwave parametric amplifier as recited in claim 12 including a second frequency selective barrier within said input signal cavity for defining an intermediate signal cavity for storing energy therein at a frequency between the frequencies of said input signal and said pump signal.

14. A microwave parametric amplifier as recited in claim 13 wherein said pump signal is a harmonic of said input signal and said intermediate signal cavity is a harmonic of said input signal.

15. A microwave parametric amplifier as recited in claim 12 wherein said pump signal is a harmonic of said input signal.

16. A microwave parametric amplifier as recited in claim 12 wherein said circulator and said pump signal port are both connected to a common surface of said housing.

17. A microwave parametric amplifier as recited in claim 12 wherein said non-linear medium and said frequency selective barrier are each planar members.

18. A microwave parametric amplifier, comprising:

a housing having an interior cavity, a circulator having an input signal port for receiving an input signal, an output signal port and a bidirectional port which is coupled to the interior cavity of said housing, a pump signal port coupled to the interior cavity of said housing for receiving a pump signal, a planar non-linear medium within said interior cavity for receiving said pump signal and thereby liberating carriers therein, a first planar frequency selective barrier within said interior cavity, said frequency selective barrier substantially reflective to said pump signal and substantially transparent to said input signal, wherein said frequency selective barrier defines a pump signal resonant cavity within said housing interior cavity, at least one planar temperature compensation dielectric layer between said non-linear medium and said frequency selective barrier, a second planar frequency selective barrier which is substantially reflective to an intermediate frequency signal and is substantially transparent to said input signal and which defines an intermediate frequency cavity within said housing, said intermediate frequency cavity tuned to an intermediate frequency which is between the frequencies of said input signal and said pump signal, at least one planar temperature compensation dielectric layer adjacent said second frequency selective barrier, and wherein an output signal is produced within said interior cavity as a result of interaction of said input signal and said carriers, said output signal is conveyed through said bidirectional port to said output port of said circulator, and wherein said output signal is at the frequency of said input signal and has a greater amplitude than said input signal.

19. A microwave parametric amplifier as recited in claim 18 wherein said pump signal port and said circulator are connected to a common surface of said housing.

20. A microwave parametric amplifier as recited in claim 18 wherein there are two temperature compensation dielectric layers between said non-linear medium and said first frequency selective barrier and there are two temperature compensation dielectric layers adjacent said second frequency selective barrier.

* * * * *